(12) United States Patent
Dehnert et al.

(10) Patent No.: US 7,917,823 B2
(45) Date of Patent: Mar. 29, 2011

(54) DECOUPLED CLOCKING IN TESTING ARCHITECTURE AND METHOD OF TESTING

(75) Inventors: David Dehnert, Portland, OR (US); Matthew Heath, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 12/317,872

(22) Filed: Dec. 30, 2008

(65) Prior Publication Data

US 2010/0169728 A1     Jul. 1, 2010

(51) Int. Cl.
*G01R 31/28* (2006.01)

(52) U.S. Cl. ............. 714/731; 714/25; 714/30; 714/32; 714/724; 714/726; 714/727; 714/729; 714/744; 714/742; 714/733; 714/734; 702/118; 702/117; 702/120

(58) Field of Classification Search ................. None
See application file for complete search history.

(56) References Cited

U.S. PATENT DOCUMENTS

| | | | | |
|---|---|---|---|---|
| 5,909,451 | A * | 6/1999 | Lach et al. ................. | 714/726 |
| 6,327,684 | B1 * | 12/2001 | Nadeau-Dostie et al. ..... | 714/731 |
| 7,076,709 | B2 * | 7/2006 | Vermeulen et al. ........... | 714/729 |
| 7,124,342 | B2 * | 10/2006 | Wang et al. .................. | 714/741 |
| 7,529,294 | B2 * | 5/2009 | Grise et al. .................. | 375/224 |
| 2004/0268181 | A1 * | 12/2004 | Wang et al. .................. | 714/30 |
| 2005/0055615 | A1 * | 3/2005 | Agashe et al. ............... | 714/727 |
| 2007/0198882 | A1 * | 8/2007 | Namura et al. .............. | 714/726 |
| 2008/0005635 | A1 * | 1/2008 | Kaibel et al. ................ | 714/731 |
| 2009/0187801 | A1 * | 7/2009 | Pandey ....................... | 714/729 |

* cited by examiner

*Primary Examiner* — John P Trimmings
(74) *Attorney, Agent, or Firm* — Winkle, PLLC

(57) ABSTRACT

A test architecture and method of testing are disclosed to allow multiple scan controllers, which control different scan chain designs in multiple logic blocks, to share a test access mechanism. During test mode, the test architecture is configured to decouple clock sources of the test access mechanism, the scan controllers and the scan chains.

15 Claims, 2 Drawing Sheets

DECOUPLED CLOCKING IN TESTING ARCHITECTURE AND METHOD OF TESTING

BACKGROUND

1. Technical Field

Embodiments of the invention relate generally to scan testing in a System-on-a-Chip (SoC) or SoC-like design, and more particularly to a test architecture and method of applying decoupled clocking in scan testing.

2. Description of Related Art

System-on-a-Chip (SoC), a design style in which multiple cores such as processors and memories are integrated on a single piece of silicon, is currently widely used. Design efforts for a SoC can be greatly reduced by employing reusable Intellectual Property (IP) cores. However, manufacturing test and debug of such designs is difficult because different IP cores often employ different scan methodologies, e.g., different scan cell designs, different scan system architectures, and/or different clocking styles.

To test a core, many scan methodologies require an external test equipment to be able to directly control a scan clock of a core under test, to send and receive scan chain data synchronously with that scan clock, and to directly control the core's functional clock to disable it while the scan chain is shifting and to enable it while applying the scan test to the core logic. However, it is costly to add global routing between each core and pins of the chip, and/or to add pins to the chip exclusively for test. Therefore, it is common for all cores to share a test access mechanism and to re-use a set of functional mode pins. Due to the different clock styles and frequencies of the scan chains, of the cores, of the interconnect between the cores, and of the functional mode of the pins, sharing and re-use of pins are very difficult and lead to a very complex test interface design.

BRIEF DESCRIPTION OF THE DRAWINGS

Embodiments of the invention are disclosed hereinafter with reference to the drawings, in which.

DETAILED DESCRIPTION

Figure 1:
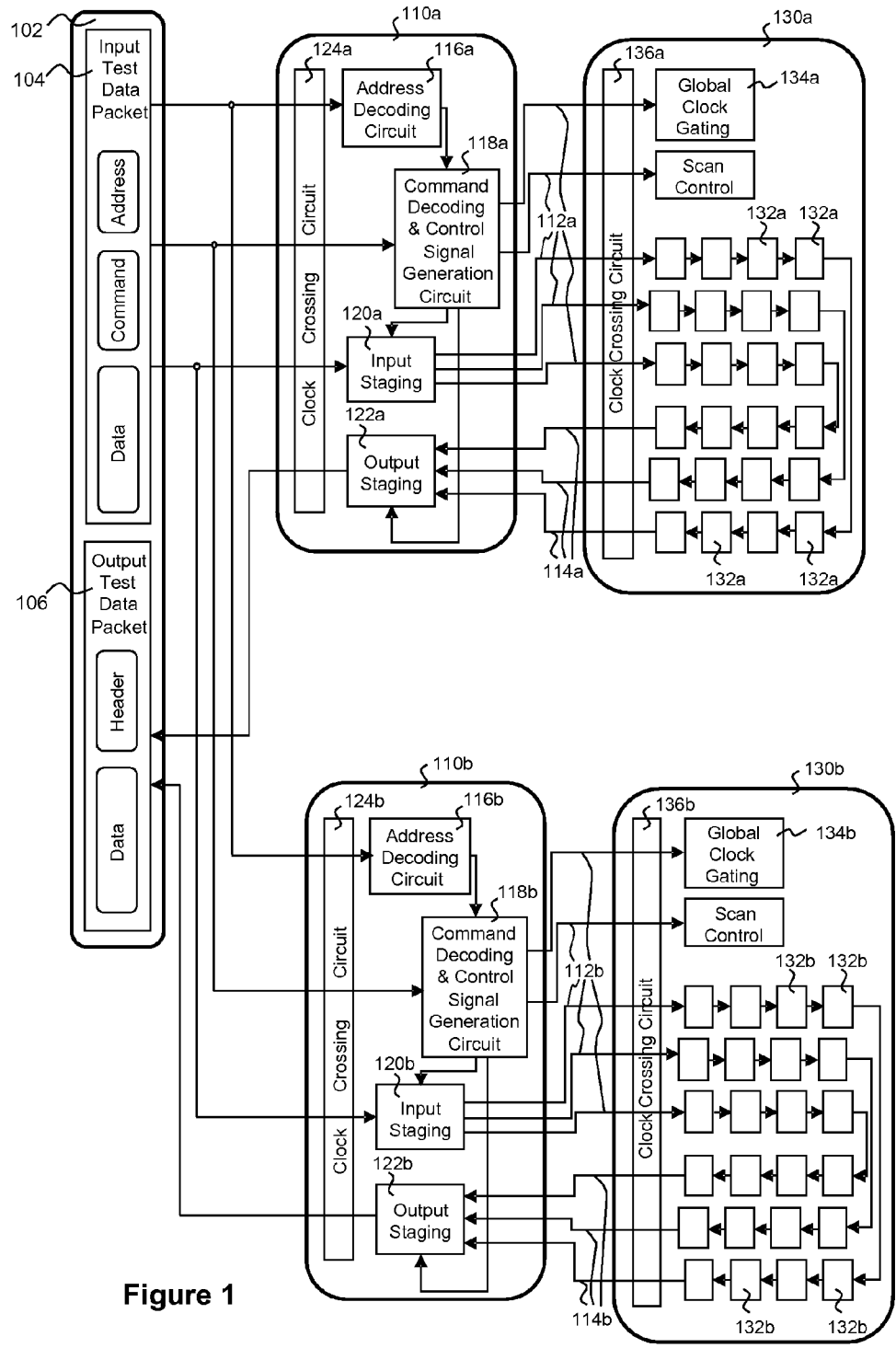
FIG. 1 is a block diagram of a test architecture according to one embodiment of the invention.

In the following description, numerous specific details are set forth in order to provide a thorough understanding of various illustrative embodiments of the invention. It will be understood, however, to one skilled in the art, that embodiments of the invention may be practiced without some or all of these specific details. In other instances, well known process operations have not been described in detail in order not to unnecessarily obscure pertinent aspects of embodiments being described. In the drawings, like reference numerals refer to same or similar functionalities or features throughout the several views.

Embodiments of the invention provide a test architecture which includes a test access mechanism for transferring parallel test data between a tester and multiple scan controllers which control different scan chain designs in multiple logic blocks. The scan chains, the cores, the interconnect between the cores, and the I/O port used for test access may operate with different clock sources, possibly running at different frequencies and possibly with different clocking styles, in both test mode and functional mode. During scan testing, embedded command fields in input test data packets instruct the scan controllers to deactivate functional clocks of the logic blocks and generate shift clocks for the scan chains. This test architecture and method allow reuse of logic blocks with different scan architectures, scan cell types, and scan clocking requirements to interface to a common test access mechanism in a System-on-Chip design. This test architecture and method also enables test optimization through use of the full I/O bandwidth of the tester even though data path widths and clock frequencies of the test access mechanism and a core's scan chains may be different. The test access mechanism may interface with a tester through any data port available on the chip using the port's native clock but operating in a transparent mode supporting data formats other than functional-mode protocol.

FIG. 1 is a block diagram of a test architecture according to one embodiment of the invention. The test architecture of FIG. 1 illustrates a test access mechanism 102 coupled to two scan controllers (110a, 110b) which are in turn coupled to two logic blocks (130a, 130b). It is to be appreciated that embodiments of the invention also apply to other test architectures involving a test access mechanism coupled to and sharing multiple scan controllers which are in turn coupled to multiple logic blocks. It is also to be appreciated that while the test access mechanism 102 of FIG. 1 has a star structure, other structures, e.g. ring, may be used as required.

The scan controllers (110a, 110b) are fabricated on-die to serve as an interface between a test access mechanism 102 and scan chains (132a, 132b) of logic blocks (130a, 130b) within a System-on-Chip design. The scan controllers (110a, 110b) are configured to receive input test data packets 104 from a test access mechanism 102 and transmit output test data packets 106 to the test access mechanism 102. The scan controllers (e.g. first scan controller 110a and second scan controller 110b) are further configured to generate test stimulus (112a, 112b) to be transmitted to respective logic blocks (e.g. first logic block 130a and second logic block 130b) and receive test responses (114a, 114b) from the logic blocks (130a, 130b). To this purpose, each of the scan controllers (110a, 110b) include an address decoder circuit (116a or 116b), a command decoding and control signal generation circuit (118a or 118b) to generate test stimulus from an input test data packet 104, an input staging circuit (120a or 120b) and an output staging circuit (122a or 122b) for processing an exchange of test stimulus (112a or 112b) and test response (114a or 114b) between a scan controller (110a or 110b) and scan chains (132a or 132b) of a logic block (130a or 130b). Each scan controller (110a or 110b) also includes a clock domain crossing circuit (124a or 124b) interfacing the test access mechanism 102 and the various circuits of the scan controller (110a or 110b). The clock domain crossing circuit (124a or 124b) enables clock crossing of an input and an output test data packet transferring between the test access mechanism 102 and each scan controller (110a or 110b), where the test access mechanism 102 and the scan controllers (110a, 110b) may be operated by different clock sources. In certain embodiments, the clock source of the test access mechanism 102 may operate in the same clock frequency as some scan controllers and may operate with different clock frequency as certain other scan controllers.

Each of the logic blocks (130a, 130b) includes a global clock gating circuit (134a or 134b) to control a functional clock of the logic block (130a or 130b). More particularly, the global clock gating circuit is to deactivate the functional clock upon entering test mode and subsequently to activate the functional clock for at least one cycle when a test stimulus (112a, 112b) is provided to generate a test response (114a, 114b). Each logic block (130a or 130b) also includes multiple scan chains (132a, 132b) to control and observe the circuits of a logic block (130a or 130b) under test, and a clock domain crossing circuit (136a or 136b) interfacing the logic block (130a or 130b) to a respective scan controller (110a or 110b). The clock domain crossing circuit (136a or 136b) disposed in a logic block enables clock crossing of test stimulus (112a, 112b) and test responses (114a, 114b) transferring between the scan controllers (110a, 110b) and logic blocks (130a, 130b), both of which may be operated by different clock sources. In certain embodiments, clock sources of the scan controllers (110a, 110b) and logic blocks (130a, 130b) operate at the same and/or at different frequencies.

The test access mechanism 102 may provide a test bus to transfer input and output test data packets 106 between the test access mechanism 102 and the scan controllers 110a, 110b. By decoupling the clock sources and enabling clock domain crossing, a test access mechanism 102 may be shared by multiple scan controllers (110a, 110b) and/or logic blocks (130a, 130b) with different scan chain designs (e.g. different number of scan chains, different clocking styles and/or different clocking frequencies).

Figure 2:
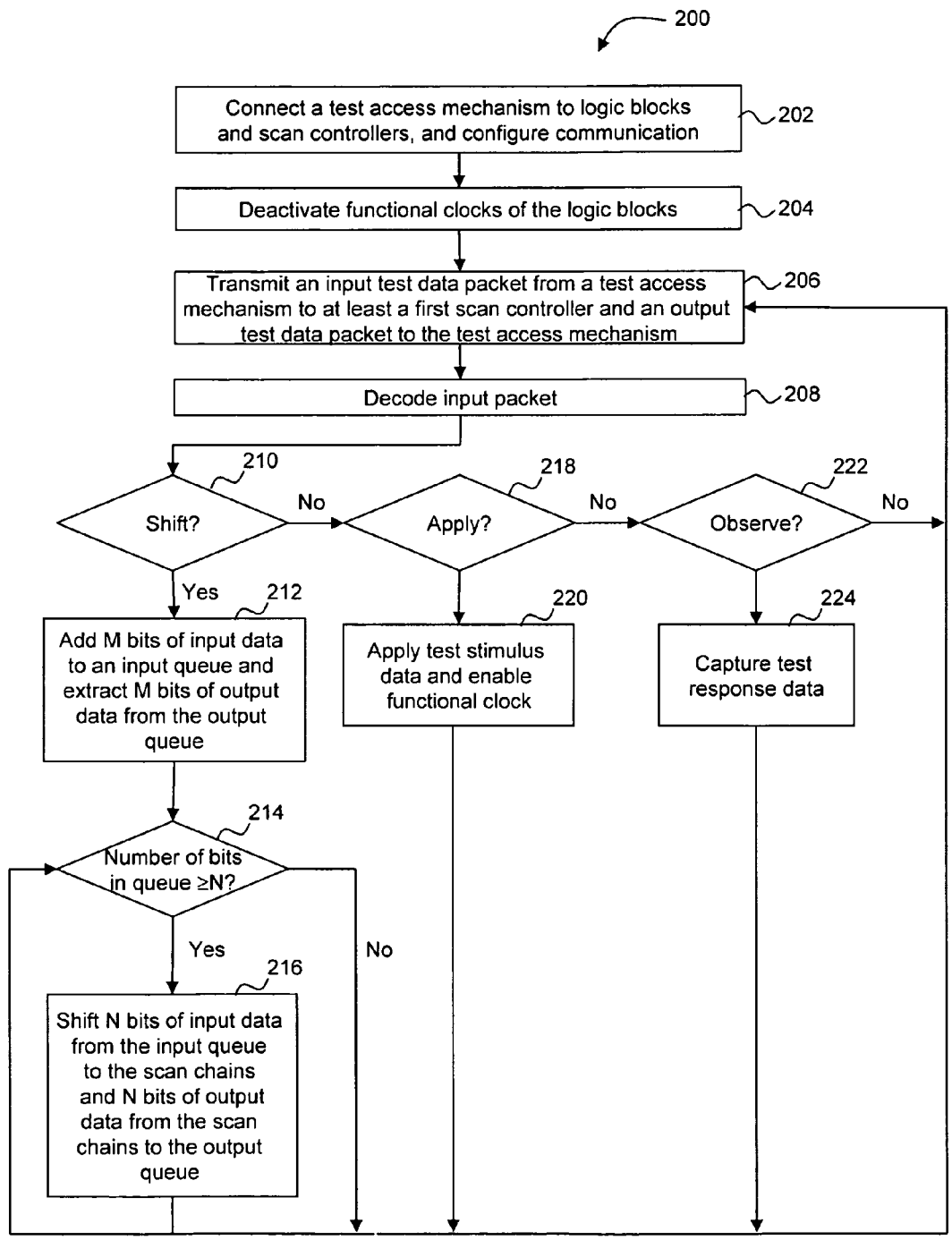
FIG. 2 is a flow sequence for testing an integrated circuit according to one embodiment of the invention.

FIG. 2 is a flow sequence for testing an integrated circuit according to one embodiment of the invention. The flow sequence begins with connecting a test access mechanism 102 to multiple scan controllers (110a, 110b) which are in turn connected to multiple logic blocks (130a, 130b), and configuring to enable communication therebetween (block 202). The device under test is then entered into a test mode in which the functional-mode clocks of the logic blocks (130a, 130b) are deactivated (block 204).

An M-bit-wide input test data packet 104, which may contain address, command and data fields, is transmitted from the test access mechanism 102 to at least a first scan controller 110a; simultaneously, an M-bit-wide output test data packet 106 containing test response data bits is transmitted from the first scan controller 110a to the test access mechanism 102 (block 206). Because the test access mechanism 102 and the first scan controller 110a have different clock sources, the transfer of the input and output test data packets therebetween utilizes a first clock crossing circuit 124a disposed in the first scan controller 110a.

The command field of the input test data packet 104 is then decoded by a command decoding circuit 116a in the first scan controller 110a to generate a first test stimulus 112a (block 208). The first test stimulus 112a is then applied to a first logic block 130a. In some embodiments, clock crossing is not required between the first scan controller 110a and the first logic block 130a. In certain other embodiments where clock crossing is required between the first scan controller 110a and the first logic block 130a, a second clock crossing circuit 136a is disposed in the first logic block 130a to receive the first test stimulus 112a.

If the command is SHIFT (block 210), the first scan controller 110a adds M bits of input data to an input queue and extracts M bits of output data from the output queue (block 212). A test writer should be aware of the bandwidths of the test access mechanism 102 and scan chains 132a and of the queue capacity. Overflowing the input queue may be avoided by sending No Operation (NOP) commands if necessary.

Subsequently, if the number of bits in the input queue is greater than N, which refer to the number of scan chains 132a (block 214), the first scan controller 110a pulses the chain shift clock(s) to shift N bits of input data from the input queue to the scan chains 132a and N bits of output data from the scan chains 132a to the output queue (block 216). The first scan controller 110a may generate additional chain shift clock pulses at periodic intervals until the input queue contains fewer than N bits. During this process, more input test data packets 104 may arrive from the test access mechanism 102.

If the command is APPLY (block 218), the first scan controller 110a applies a test stimulus 112a to the system logic of a first logic block 130a by asserting the appropriate scan chain control signals (varies depending on scan design) and enabling the functional-mode clock of the first logic block 130a for at least one cycle (block 220). An APPLY command typically follows a series of SHIFT commands which load the first test stimulus 112a into the scan chains 132a of the first logic block 130a.

If the command is OBSERVE (block 222), the first scan controller 110a captures the first test response 114a into the scan chains 132a by asserting the appropriate scan chain control signals (varies depending on scan design) of the first logic block 130a, and if necessary activating the functional clock of the scan chains 132a for 1 cycle (block 224). An OBSERVE command typically precedes a series of SHIFT commands which unloads the first test response 114a from the scan chains 132a of the first logic block 130a.

In the above-described flow sequence, an input test data packet 104 is transmitted from a test access mechanism 102 to a first scan controller 110a and further to scan chains 132a of a first logic block 130a coupled thereto. In embodiments having a test architecture involving multiple scan controllers (110a, 110b) and logic blocks (130a, 130b), it is to be appreciated that the above-described flow sequence is also applicable with suitable modifications.

Scan testing of the logic blocks may be performed separately or concurrently in embodiments involving multiple scan controllers and logic blocks. In one embodiment where testing of the logic blocks is concurrent, an input test data packet may be broadcast from the test access mechanism to multiple identical logic blocks without requiring that the latency from the tester to each of the identical logic blocks be equal. In this embodiment which may be represented by FIG. 1, an input test data packet 104 that is transmitted to a first scan controller 110a and a first logic block 130a, is also transmitted to a second scan controller 110b and a second logic block 130b. In addition to the above-described flow sequence 200, it is to be appreciated that the second scan controller 110b includes a third clock domain crossing circuit 124b to receive the input test data packet 104. If required, the second logic block 130b may also include a fourth clock domain crossing circuit 136b to receive a second test stimulus 112b which is generated from the input test data packet 104 by the second scan controller 110b.

By decoupling a tester interface from internal scan chains of logic blocks of a device under test, embodiments of the invention allow both tester interface and scan chains to operate in native clock domains without requiring direct clock control by the tester. Accordingly, this supports sharing of an on-chip test access mechanism by heterogeneous logic blocks with different scan designs.

Further, by enabling different data bandwidths on a test access mechanism and scan chains, i.e., width of input and output test data packets (M-bits or first bandwidth) exchanged between the test access mechanism and scan controller(s) may be different from the width of test stimulus and test response scan chains (N-bits or second bandwidth) exchanged between the scan controller(s) and scan chains in the logic block(s). Accordingly, the test data bandwidth is not limited to a product of the more narrow data path width times a slower clock frequency, even though the slower clock domain may have a wider bandwidth or the clock domain with more narrow bandwidth may have a faster clock frequency.

Other embodiments will be apparent to those skilled in the art from consideration of the specification and practice of the invention. Furthermore, certain terminology has been used for the purposes of descriptive clarity, and not to limit the disclosed embodiments of the invention. The embodiments and features described above should be considered exemplary, with the invention being defined by the appended claims.

What is claimed is:

1. A test architecture comprising:
    a first logic block having a plurality of first scan chains; and
    a first scan controller including:
        a first clock domain crossing circuit to process an exchange of an input test data packet and an output test data packet between the first scan controller and a test access mechanism which are operated by different clock sources,
        a first decoding circuit to generate a first test stimulus from the input test data packet, and
        a first input staging circuit and a first output staging circuit to process an exchange of additional first test stimulus and a first test response between the first scan controller and the first scan chains of the first logic block.

2. The test architecture of claim 1, wherein the scan controller and the test access mechanism are further operated in different clock frequencies.

3. The test architecture of claim 1, further comprising:
    a second clock domain crossing circuit disposed in the first logic block to process an exchange of the additional first test stimulus and the first test response between the first scan controller and the first scan chains of the first logic block.

4. The test architecture of claim 1, wherein the first scan controller and the first scan chains are operated by different clock sources.

5. The test architecture of claim 4, wherein the first scan controller and the first scan chains are further operated in different clock frequencies.

6. The test architecture of claim 1, wherein the input test data packet and the first test stimulus have different bandwidths.

7. A method of testing, comprising:
    connecting a test access mechanism to a plurality of scan controllers which are coupled to a plurality of logic blocks having different scan chain designs;
    deactivating a functional clock of a first of the logic blocks;
    transmitting an input test data packet from the test access mechanism to a first of the scan controllers, wherein the test access mechanism and the first of the scan controllers are operated by different clock sources;
    applying a first test stimulus, generated from the input test data packet, to the first of the logic blocks;
    activating the functional clock of the first of the logic blocks for at least one clock cycle;
    receiving a first test response from the first of the logic blocks; and
    transmitting an output test data packet from the first of the scan controllers to the test access mechanism.

8. The method of claim 7, wherein transmitting an input test data packet from the test access mechanism to a first of the scan controllers includes receiving the input test data packet at the first scan controller through a first clock domain crossing circuit.

9. The method of claim 8, wherein applying a first test stimulus includes receiving the first test stimulus at the first of the logic blocks through a second clock domain crossing circuit.

10. The method of claim 7, wherein transmitting an input test data packet includes transmitting the input test data packet to a second of the scan controllers, wherein the first and the second of the scan controllers are operated by different clock sources.

11. The method of claim 10, wherein transmitting the input test data packet to a second of the scan controllers includes receiving the input test data packet at the second of the scan controllers through a third clock domain crossing circuit.

12. The method of claim 11, further comprising:
    applying a second test stimulus, generated from the input test data packet, to the second of the logic blocks, through a fourth clock domain crossing circuit.

13. The method of claim 7, wherein transmitting an input test data packet includes having the test access mechanism and the first of the scan controllers operate in different clock frequencies.

14. The method of claim 7, wherein transmitting an input test data packet includes having the first of the scan controllers and a plurality of scan chains of the first of the logic blocks operate by different clock sources.

15. The method of claim 7, wherein transmitting an input test data packet includes transmitting the input test data packet having a first bandwidth, and applying a first test stimulus includes applying the first test stimulus having a second bandwidth which is different from the first bandwidth.

* * * * *